United States Patent
Kilian et al.

(10) Patent No.: US 7,005,915 B2
(45) Date of Patent: Feb. 28, 2006

(54) SERIES BRIDGE CIRCUIT WITH AMPLIFIERS

(75) Inventors: Wayne T. Kilian, Richardson, TX (US); Jason M. Chilcote, Frisco, TX (US)

(73) Assignee: Honeywell International Inc., Morristown, NJ (US)

( * ) Notice: Subject to any disclaimer, the term of this patent is extended or adjusted under 35 U.S.C. 154(b) by 54 days.

(21) Appl. No.: 10/789,070

(22) Filed: Feb. 27, 2004

(65) Prior Publication Data
US 2005/0189988 A1   Sep. 1, 2005

(51) Int. Cl.
*H03F 7/06* (2006.01)

(52) U.S. Cl. ................. 330/6; 330/11; 330/51
(58) Field of Classification Search ............ 330/6, 330/11, 146, 150, 69, 51
See application file for complete search history.

(56) References Cited

U.S. PATENT DOCUMENTS

| | | | |
|---|---|---|---|
| 3,497,824 A | | 2/1970 | Goordman |
| 5,337,013 A | * | 8/1994 | Langer et al. ............ 324/537 |
| 5,834,952 A | * | 11/1998 | Ngo ............................ 327/54 |
| 6,104,187 A | | 8/2000 | Marx et al. |
| 6,195,228 B1 | | 2/2001 | Bennett et al. ............ 360/112 |
| 6,445,171 B1 | * | 9/2002 | Sandquist et al. ...... 324/117 R |
| 6,577,187 B1 | * | 6/2003 | Lesko ....................... 330/11 |

FOREIGN PATENT DOCUMENTS

DE   2333080   1/1975

OTHER PUBLICATIONS

Munter, P. , "Spinning-Current Method for Offset Reduction in Silicon Hall Plates", Delft University Press, Delft, The Netherlands,(1992), "no month".

* cited by examiner

*Primary Examiner*—Don Le
*Assistant Examiner*—Lam T. Mai
(74) *Attorney, Agent, or Firm*—Kris T. Fredrick

(57) ABSTRACT

Two bridge type transducers are coupled in series with their outputs each driving one of a pair of differential amplifiers, with the outputs tied together in a push-pull configuration. In further embodiments, push-pull operation is obtained by matching amplifier gain components and using current mirrors. Lower voltage operation may be achieved by simple diode level shifting of the transducer outputs. In one embodiment, the transducers comprise Hall effect sensors.

20 Claims, 3 Drawing Sheets

SERIES BRIDGE CIRCUIT WITH AMPLIFIERS

FIELD OF THE INVENTION

The present invention relates to circuits, and in particular to a series bridge circuit in a complimentary push-pull configuration.

BACKGROUND OF THE INVENTION

The Hall effect occurs when a conductor carrying current is placed in a magnetic field. A voltage is generated according to the cross product of the field and flow of current. Sensors operating on the Hall effect can be modeled like a Wheatstone bridge. Multiple sensors may be used in parallel, and are typically coupled to a differential amplifier to measure the generated voltage. To reduce current, several different implementations of bridges have been used, including thin conducting layers, commutation of a single bridge, or modifying the duty cycle of the bridges. These arrangements increase the complexity and cost of the sensor.

SUMMARY OF THE INVENTION

Two bridge type transducers are coupled in series with their amplifier outputs tied together. In one embodiment, the outputs are tied together in a push-pull configuration. In further embodiments, push-pull operation is obtained by matching amplifier gain components and using current mirrors. Lower voltage operation may be achieved by simple diode level shifting of the transducer outputs. In one embodiment, the transducers comprise Hall effect sensors.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
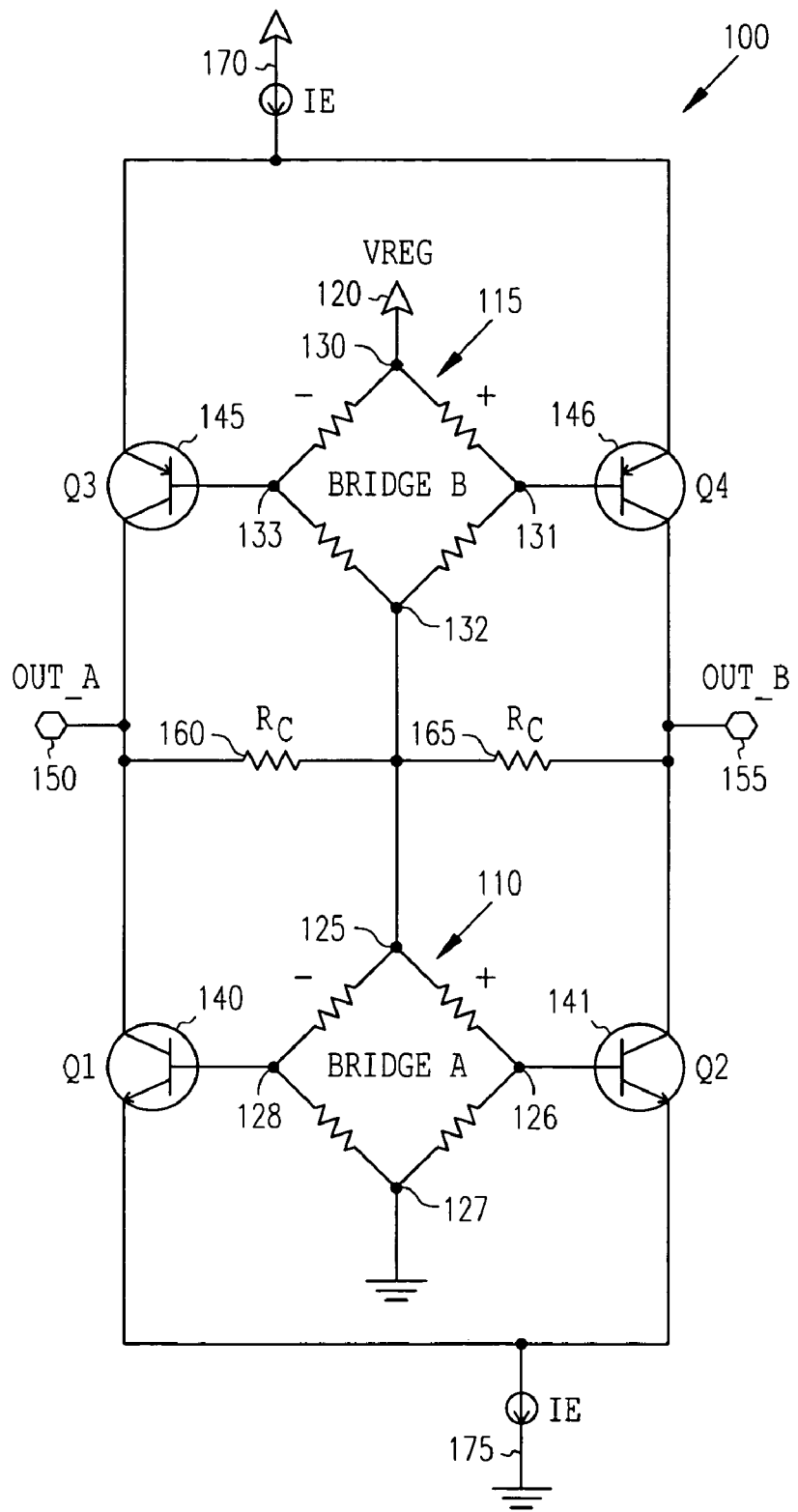
FIG. 1 is a circuit diagram of a pair of series connected bridge type transducers according to an embodiment of the invention.

A bridge amplifier circuit is shown generally at 100 in FIG. 1. The bridge amplifier circuit 100 comprises a first bridge circuit 110 coupled in series with a second bridge circuit 115 and with a regulated voltage 120 to provide a current flowing through the bridges. In one embodiment, the bridge circuits comprise Hall effect transducers, which may be represented as Wheatstone bridges, having four resistors coupled in a diamond shape. Bridge 110 comprises four resistors coupled between points 125, 126, 127 and 128, and bridge 115 comprises four resistors coupled between points 130, 131, 132, and 133.

In FIG. 1, the regulated voltage 120 is coupled to point 130, through resistors to points 131 and 133, and then through further resistors to point 132. Point 132 is coupled to point 125, through resistors to points 126 and 128, and through further resistors to point 127, and ground.

A first differential amplifier is coupled to the first bridge circuit 110 and comprises a pair of transistors 140 and 141, each having a base or input coupled to points 128 and 126 respectively. In one embodiment, transistors 140 and 141 are npn transistors. A second differential amplifier is coupled to the second bridge circuit 115 and comprises a pair of transistors 145 and 146, each having a base or input coupled to points 133 and 131 respectively. In one embodiment, transistors 145 and 146 are pnp transistors. Collectors of transistors 140 and 145 are coupled to a first output 150. Collectors of transistors 141 and 146 are coupled to a second output 155. The outputs 150 and 155 are coupled to points 125 and 132, between the series coupled bridges by respective loads 160 and 165. In one embodiment, the loads comprise resistors. Current flowing through emitters of the transistors are represented at 170 and 175 labeled $I_E$. Current 170 is effectively sourced from a supply, and current 175 is sinking to ground. The gain of the circuit is proportional to the resistance of the total load, and $I_E$.

In one embodiment, the differential amplifiers are coupled in a push-pull configuration, where points 128 and 133 are negative, and points 126 and 131 are positive. The push-pull configuration effectively doubles the gain of the circuit compared to each half circuit and allows a large dynamic range on the output. By placing the bridges in series with the voltage supply, the current flowing through the bridges is reduced, providing a low current sensor. The circuit is also fairly simple, reducing the complexity and cost of manufacture.

In one embodiment, the circuit 100 is formed on a semiconductor substrate, and the distance between bridges 110 and 115 may be varied significantly depending on whether it is necessary to sense a common mode versus differential magnetic field.

Figure 2:
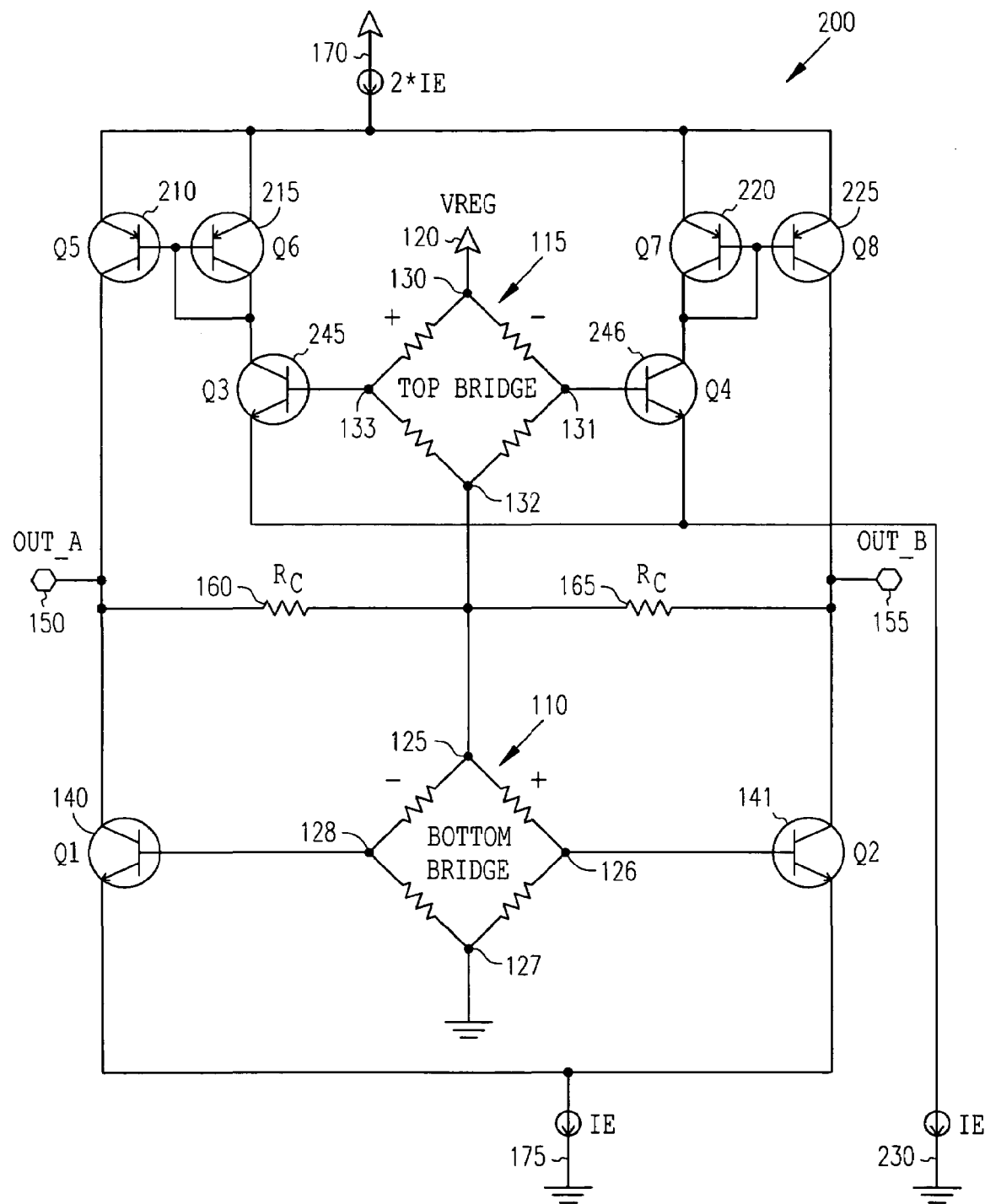
FIG. 2 is a circuit diagram of an alternative pair of series connected bridge type transducers according to an embodiment of the invention.

FIG. 2 is a modified circuit 200 for improved gain/common mode offset properties. Like elements are numbered the same as in FIG. 1. In this embodiment, current mirrors 210, 215 and 220, 225 are added to a npn differential pair of transistors 245 and 246 respectively. Emitters of transistors 245 and 246 have a bias current 230 to ground. The current mirrors each comprise a pair of transistors having their bases coupled to each other and to the collector of the respective differential transistors 245 and 246. The collector of current mirror transistor 215 is also coupled to the bases of the transistors 210 and 215. The collector of transistor 210 is coupled to output 150, while the emitters of both transistors 210 and 215 are coupled, and produce approximately twice the emitter current 170 of the circuit of FIG. 1. In this embodiment, the top differential pair of transistors 245 and 246 are npn transistors, and the polarity of the top bridge is reversed. Transconductance of the top and bottom portions of the circuit 100 are substantially balanced.

Figure 3:
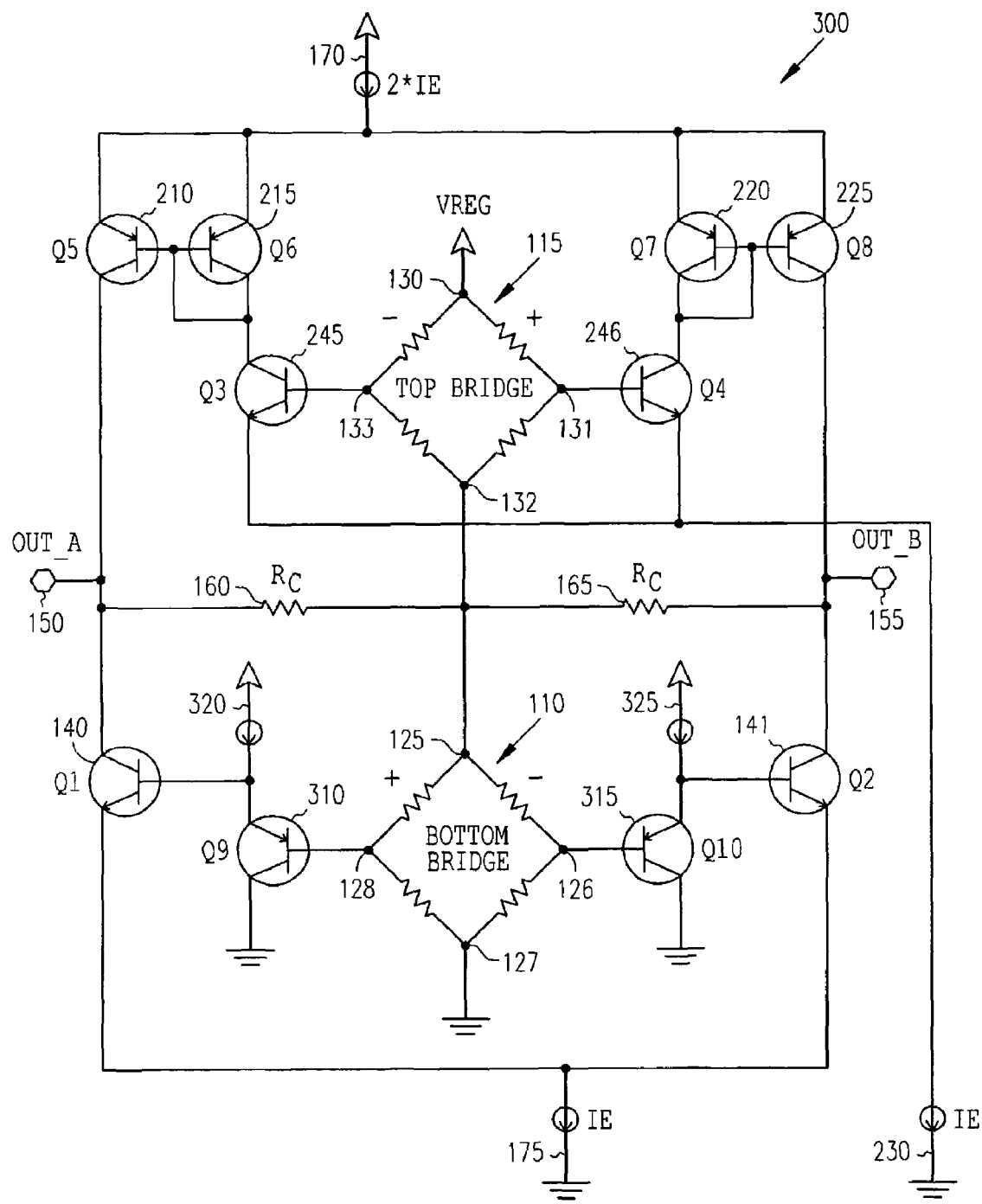
FIG. 3 is a circuit diagram of a further alternative pair of series connected bridge type transducers according to an embodiment of the invention.

FIG. 3 is a modified circuit 300, wherein the bridges have the same polarity as in FIG. 2. Circuit 300 has the same current mirror arrangement for the top bridge 115, but has a pair of level shifting devices 310 and 315 to provide for lower voltage operation of circuit 300 by reducing the number of $V_{BE}$ drops required for placing the differential amplifiers in the proper operating ranges. In one embodiment, level shifting device 310 and 315 comprise pnp transistors, each having a base coupled to opposite corners of the bottom bridge 110. Their collectors are coupled to ground, and their emitters are coupled to respective current sources 320 and 325, as well as to respective bases of differential transistors 140 and 141. In further embodiments, diodes or other devices may be used to provide the level shifting, and alternative processing technologies such as CMOS or BiCMOS may be used to implement the present invention. Those skilled in the art will recognize that the individual bridges 110 and 115 as well as the individual transistors can represent a plurality of bridges or transistors in order to reduce noise or offsets.

CONCLUSION

Two transducers are arranged in series, across a regulator or supply. The transducers may be Hall effect devices or any general Wheatstone bridge transducer arrangement. Each transducer feeds a differential input type stage, with a lower stage sinking current towards ground, and the other sourcing current from the supply. While the differential input stages are represented as simple transistors, many different implementations of such stages may be used. The outputs are tied together in a push-pull configuration. The input polarity of the transducers is dependent on whether the transducers are to be collocated or separated in a differential transducer configuration. The gain can be limited or temperature compensated by placing appropriate loads, such as resistors from each output to a reference voltage, and by adjusting the tail current level and associated temperature coefficient. Common mode improvements are made by matching the amplifier gain components and using current mirrors to achieve the push-pull operation. Lower voltage operation can be achieved by simple diode level shifting of the transducer outputs. In further embodiments, the circuit may be implemented within monolithic silicon integrated circuits, using bipolar technology with Hall effect, magnetoresistive or piezoresistive sensing elements.

What is claimed is:

1. A circuit comprising:
a first bridge transducer;
a second bridge transducer coupled in series with the first bridge transducer and a supply;
a first differential amplifier having inputs coupled to the first bridge transducer; and
a second differential amplifier having inputs coupled to the second bridge transducer, wherein the first and second differential amplifiers each have a pair of outputs, respective ones of which are coupled to provide two outputs of the circuit representative of a sensed parameter.

2. The circuit of claim 1 wherein the first and second bridge transducers comprise Hall effect sensors.

3. The circuit of claim 1 wherein the supply comprises a regulated voltage.

4. The circuit of claim 1 wherein the first and second differential amplifiers are coupled in a push-pull relationship.

5. The circuit of claim 1 wherein the first differential amplifier comprises a pair of npn transistors and the second differential amplifier comprises a pair of pnp transistors.

6. The circuit of claim 1 wherein the output comprises a load coupled between the outputs.

7. A circuit comprising:
a first bridge transducer;
a second bridge transducer coupled in series with the first bridge transducer and a supply;
a first differential amplifier having inputs coupled to the first bridge transducer; and
a second differential amplifier having inputs coupled to the second bridge transducer, wherein the first and second differential amplifiers each have a pair of outputs, respective ones of which are coupled to provide two outputs of the circuit representative of a sensed parameter.

8. A circuit comprising:
a first bridge transducer;
a second bridge transducer coupled in series with the first bridge transducer and a supply; and
a pair of differential amplifiers having outputs tied together in a push-pull configuration.

9. The circuit of claim 8 and further comprising a load between the outputs and a point between the first and second bridge transducers.

10. The circuit of claim 8 and further comprising a pair of current mirrors coupled to one of the differential amplifiers.

11. The circuit of claim 8 and further comprising a pair of diode level shifters coupled to one of the differential amplifiers.

12. A circuit comprising:
a bottom bridge transducer;
a top bridge transducer coupled in series with the bottom bridge transducer and a supply;
a bottom differential amplifier having inputs coupled to the bottom bridge transducer;
a top differential amplifier having inputs coupled to the top bridge transducer, wherein the bottom and top differential amplifiers each have a pair of outputs, respective ones of which are coupled to provide two outputs of the circuit representative of a sensed parameter;
a load coupled between the two outputs and a point where the bottom and top bridge transducers are coupled;
a pair of current mirrors coupled to the top differential amplifier; and
a pair of level shift transistors coupled between the bottom differential amplifier and the bottom bridge transducer.

13. The circuit of claim 12, wherein the differential amplifiers each comprise a pair of npn transistors.

14. The circuit of claim 13, wherein the npn transistors of the top differential amplifier each have a base coupled to opposite corners of the bridge transducer, have a collector coupled to the current mirror and have an emitter coupled to a supply sinking current to ground.

15. The circuit of claim 13, wherein the npn transistors of the bottom differential amplifier each have a base coupled to opposite corners of the bridge transducers through the level shift transistors, and have a emitters coupled to current sources 320 and 325.

16. The circuit of claim 15 wherein the level shift transducers comprise pnp transistors, each having a base coupled to opposite corners of the bridge transducer.

17. The circuit of claim 12 wherein the first and second bridge transducers comprise Hall effect sensors.

18. The circuit of claim 17 wherein the Hall effect sensors are coupled at opposite corners to the differential amplifiers, and wherein the polarity of such corners are opposite each other.

19. A method comprising:
sensing a magnetic field with a first Hall effect transducer;
sensing a magnetic field with a second Hall effect transducer coupled in series with the first bridge transducer and a supply; and
amplifying the sensed magnetic fields with a pair of differential amplifiers having outputs tied together in a push-pull configuration.

20. A circuit comprising:
means for sensing a magnetic field; and
means for amplifying the sensed magnetic fields with a pair of differential amplifiers having outputs tied together in a push-pull configuration.

* * * * *